United States Patent [19]
Hershberger

[11] Patent Number: 5,111,160
[45] Date of Patent: May 5, 1992

[54] CLOCK GENERATION CIRCUIT FOR MULTISTANDARD SERIAL DIGITAL VIDEO WITH AUTOMATIC FORMAT IDENTIFICATION

[75] Inventor: David L. Hershberger, Nevada City, Calif.

[73] Assignee: The Grass Valley Group, Nevada City, Calif.

[21] Appl. No.: 693,829

[22] Filed: Apr. 30, 1991

[51] Int. Cl.$^5$ .............................................. H03L 7/18
[52] U.S. Cl. ...................................... 331/1 A; 331/20; 331/25; 331/179; 331/DIG. 2; 358/140; 358/158
[58] Field of Search ............ 331/1 A, 16, 25, DIG. 2, 331/20, 179; 358/140, 158; 328/63

[56] References Cited

U.S. PATENT DOCUMENTS

| | | | |
|---|---|---|---|
| 4,680,555 | 7/1987 | Waldeck | 331/179 X |
| 4,958,228 | 9/1990 | Kutsuki | 358/158 |
| 4,962,427 | 10/1990 | Lunn et al. | 358/140 X |

OTHER PUBLICATIONS

Digital Transmission Systems, by David R. Smith, 1985 Van Nostrand Reinhold Company, Sec. 4.2.

Primary Examiner—Siegfried H. Grimm
Attorney, Agent, or Firm—Boulden G. Griffith; John Smith-Hill

[57] ABSTRACT

A voltage controlled reference oscillator with a high Q and narrow tunability bandwidth produces an output oscillator frequency which is frequency divided by four alternative constants to produce four different clock frequencies for four different digital video standards, D1 component at 270 MHz, NTSC D2 composite at 143 MHz, PAL D2 composite at 177 MHz, and a proposed new composite video standard that is to operate at a 360 MHz clock rate. Automatic identification of which serial digital video is present is accomplished by having the clock generator produce a clock signal at the frequency required by one of the video formats while a phase lock loop attempts to lock onto the incoming signals at that frequency. If no lock occurs within a predetermined time interval, the clock generator is made to produce a clock signal at the frequency required by a different one of the video formats and the phase lock is attempted again. This is repeated until a lock is attained. Optionally, when a lock occurs, the video is tested for validity within the format that is consistent with the clock frequency that produced the lock.

20 Claims, 9 Drawing Sheets

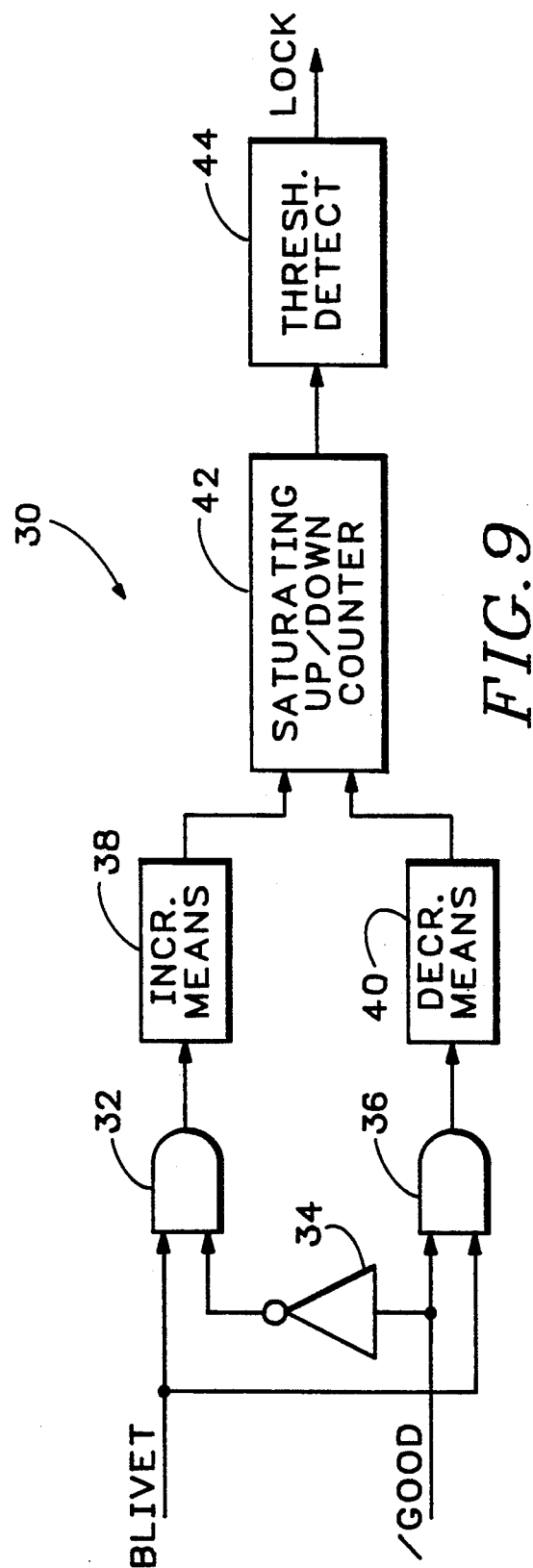

CLOCK GENERATION CIRCUIT FOR MULTISTANDARD SERIAL DIGITAL VIDEO WITH AUTOMATIC FORMAT IDENTIFICATION

BACKGROUND OF THE INVENTION

This invention relates to digital video signal processing, and more particularly to the generation of a frequency agile clock signal for use with serial video signals in any one of a number of different standard video formats.

It is very convenient to be able to handle video formatted according any one of several video standards using only one serializing or deserializing integrated circuit. However, the serial data formats of the most widely used video standards operate at different data rates. D1 component digital video (CCIR 601/SMTE RP125) standard prescribes a clock frequency of 270.000 MHz, while D2 NTSC composite digital video operates at a clock frequency of 143.182 MHz and D2 PAL composite digital video operates at a clock frequency of 177.345 MHz. And, a proposed new standard prescribes a clock frequency of 360.000 MHz.

Prior approaches to producing a frequency agile clock generator to handle digital video in the three present standards have used a voltage controlled oscillator (VCO) that operates over the full range of the present standards, from 143 to 270 MHz. The need to operate over such a wide range of frequencies has made it necessary to use an RC type oscillator. However, RC type oscillators are difficult to implement in the VHF range and have a high degree of jitter as a result of their low Q of 1.

To reduce jitter, it would be preferable to use an LC type oscillator with a higher Q, 10 to 20 or more. LC type oscillators, however, do not generally have the wide range of frequency tunability required by this application. Three or four separate oscillators could be used, switching between them as necessary. Or, one oscillator circuit could be switched between three or four different LC resonators. However, both of these approaches are expensive in terms of component cost, circuit area and alignment. It would be very difficult to implement the switching function without degrading the oscillator's performance in some respect.

SUMMARY OF THE INVENTION

It is an object of the present invention to provide a method and circuit for producing frequency agile clock signals suitable for use with D1 component digital video, NTSC and PAL D2 composite digital video signals, and a proposed new standard video format that uses a 360 MHz clock signal.

A voltage controlled reference oscillator with a high Q and narrow tunability bandwidth produces an output oscillator frequency which is frequency divided by four alternative constants to produce the four different clock frequencies for the four digital video standards, D1 component at 270 MHz, NTSC D2 composite at 143 MHz, PAL D2 composite at 177 MHz, and a proposed new component video standard that is to operate at a 360 MHz clock rate.

It is also an object of the present invention to be able to automatically identify which video standard is present and produce the appropriate clock signal accordingly.

A clock generator is made to produce a clock signal at the frequency required by one of the video formats, and a phase lock loop attempts to lock onto the incoming signals at that frequency. If no lock occurs within a predetermined time interval, the clock generator is made to produce a clock signal at the frequency required by a different one of the video formats and the phase lock is attempted again. This is repeated until a lock occurs. Optionally, when a lock is achieved, the video is tested for validity within the format that is consistent with the standard associated with the clock frequency that produced the lock.

The subject matter of the present invention is particularly pointed out and distinctly claimed in the concluding portion of this specification. However, both the organization and method of operation, together with further advantages and objects thereof, may best be understood by reference to the following detailed description and accompanying drawings.

BRIEF DESCRIPTION OF THE DRAWINGS

FIG. 9 is a block diagram of the lock detector used in the NRZ clock and data recovery system.

DETAILED DESCRIPTION

A fortunate relationship exists among the four clock frequencies that are needed for the D1 component digital video format, the NTSC and PAL D2 composite digital video formats, and the proposed new video format that uses a 360 MHz clock frequency, i.e., there is a narrow frequency band that contains a harmonic of each of these frequencies. This relationship is shown in the following table, Table 1.

TABLE 1

| STANDARD | FREQUENCY (MHz) | FACTOR | HARMONIC (MHz) |
| --- | --- | --- | --- |
| NTSC D2 | 143.182 | 15 | 2147.727 |
| PAL D2 | 177.345 | 12 | 2128.137 |
| D1 | 270.000 | 8 | 2160.000 |
| Proposed | 360.000 | 6 | 2160.000 |
| | | MID FREQ.: | 2144.069 |

Figure 1A:
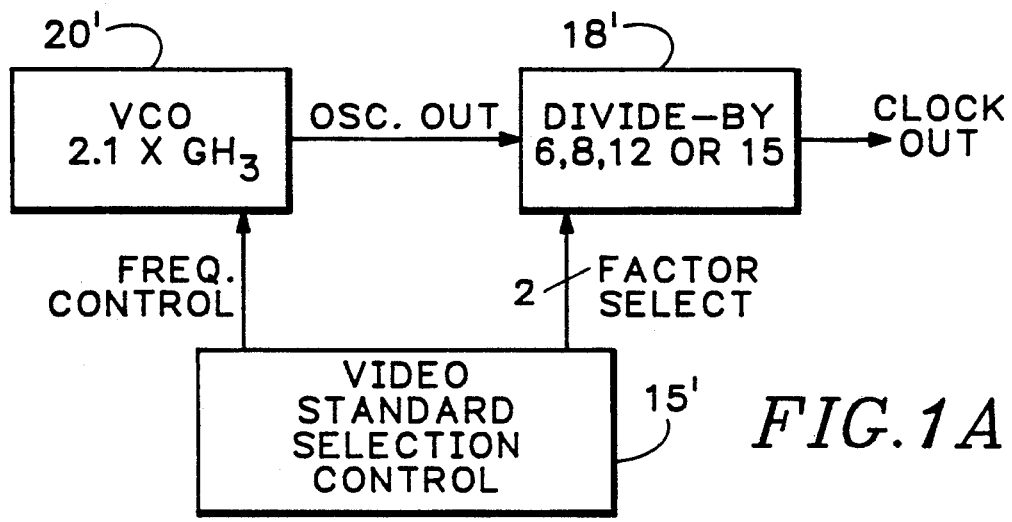
FIGS. 1A and 1B are block diagrams of clock generation circuits according to the present invention.

Note that each of the harmonic frequencies is within 0.75% of the frequency that is midway between the highest and lowest of these harmonics. Referring to FIG. 1A, a VCO 20' operating at 2144 MHz needs only be deviated up to three fourths of one percent and then divided by the respective factor by divide-by circuit 18' in order to achieve any of the four desired frequencies. A high Q, low jitter LC type oscillator can easily attain this range of frequency tunability, since with this approach the bulk of the frequency agility is provided by the digital frequency dividers 18', rather than the voltage controlled oscillator 20'.

With a much higher quality oscillator, less jitter is produced, and video equipment utilizing serializers and deserializers based on this invention can be assembled into longer and more complex chains and other arrangements without the cumulative jitter creating problems.

A video standard selection control circuit 15' generates frequency control and factor selection signals in matched pairs (as shown in the table above) to control the VCO 20' and divide-by circuit 18'. As will be seen below, a phase lock loop can be used as part of the video standard selection control circuit 15' to phase synchronize the clock frequency produced with incoming external clocks.

Although a 2.144 GHz VCO could be built in an ECL integrated circuit with an external resonator, using conventional plastic packaging, wire bonding and sockets, doing so is difficult and prone to problems because of the high frequencies involved. It is easier to build such an oscillator at a lower frequency, such as half of 2.144 GHz. Table 2 shows how the same four clock frequencies can be obtained from a source operating at 1.072 GHz:

TABLE 2

| STANDARD | FREQUENCY (MHz) | FACTOR | HARMONIC (MHz) |
|---|---|---|---|
| NTSC D2 | 143.182 | 7.5 | 1073.864 |
| PAL D2 | 177.345 | 6 | 1064.069 |
| D1 | 270.000 | 4 | 1080.000 |
| Proposed | 360.000 | 3 | 1080.000 |
| | | MID FREQ.: | 1072.035 |

Figure 1B:
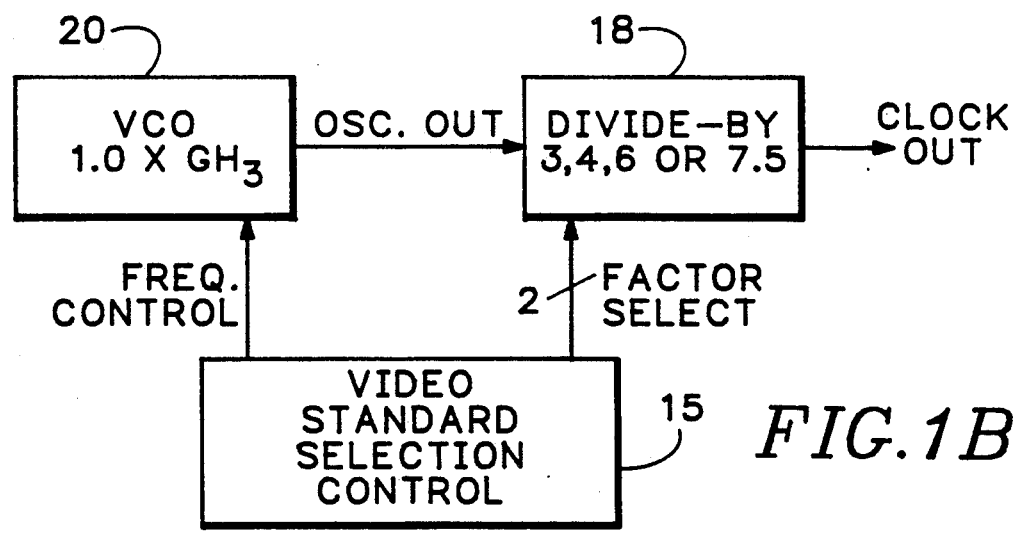

FIG. 1B shows a 1.0X GHz VCO 20 supplying an adjustable oscillator output frequency to divide-by circuit 18, which now divides that frequency by 3, 4, 6 or 7.5. Again, a video standard selection control circuit 15 generates frequency control voltages and factor selection signals in matched pairs (as shown in Table 2 above) to control the VCO 20 and divide-by circuit 18.

Figure 2:
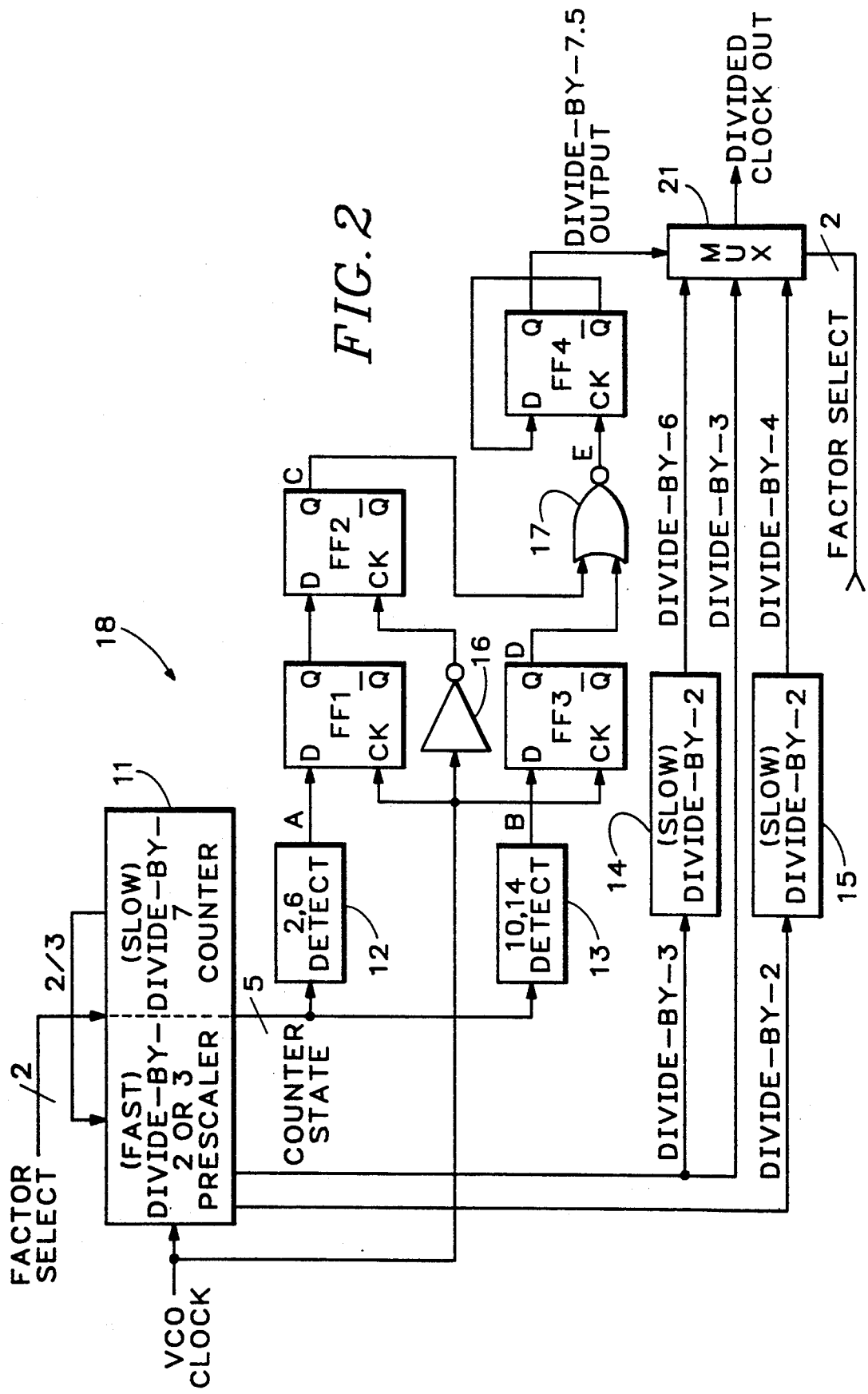
FIG. 2 is a block diagram of divide-by 3, 4, 6 or 7.5 circuitry suitable for implementing the present invention.

Referring now to FIG. 2, the divide-by 3, 4, 6 or 7.5 circuitry 18 receives the VCO clock and two factor select signals, all three of which are applied to a modulo-15 two-stage counter 11. The modulo-15 two-stage counter 11 consists of a fast prescaling section that divides by 2 or 3 and a slower divide-by-7 ripple counter. The divide-by-7 counter provides feedback on the line labeled "‡" to tell the fast divide-by-2 or 3 prescaler when to vary its modulus. The benefit to having a two-stage counter 11 is that only the two flip-flops in the prescaler have to be fast devices that consume a lot of power, while the rest of the circuitry in the divide-by 3, 4, 6 or 7.5 circuitry 18 can be made with slower devices that consume less power.

Figure 3:
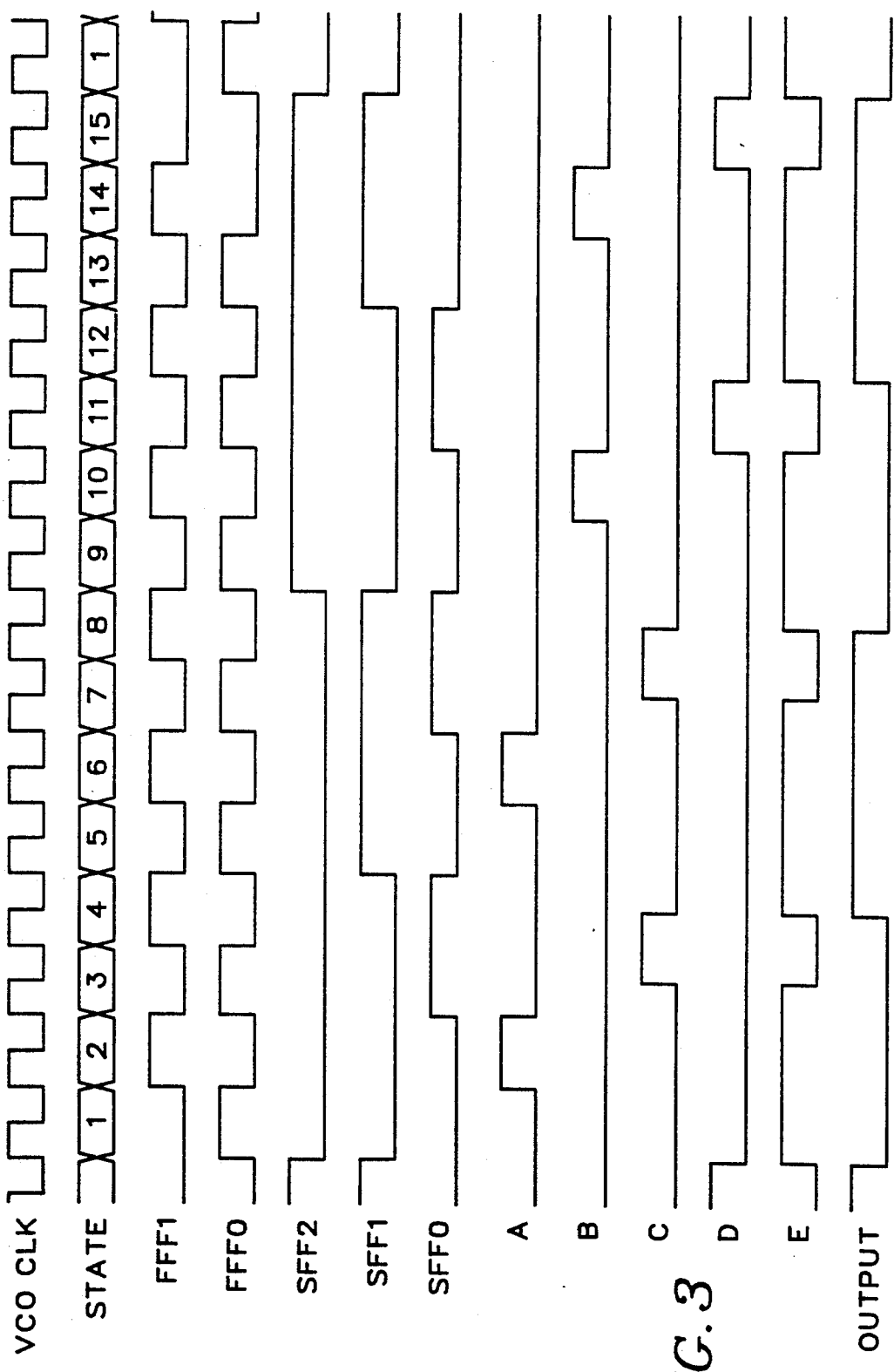
FIG. 3 is a timing diagram of the operation of the divide-by-7.5 portion of the divide-by circuitry.

Table 3 and FIGS. 2 and 3 show how the two-stage counter 11 produces 15 states, and how four of these states are detected and delayed to produce the divide-by-7.5 output. In FIG. 3, the waveforms FFF0 and FFF1 represent the states of two fast flip-flops that are part of the fast divide-by-2 or 3 prescaler, while the waveforms SFF0, SFF1 and SFF2 represent the states of three slower flip-flops that are part of the divide-by-7 section of the two-stage counter 11.

TABLE 3

| STATE | PRE-SCALER DIVIDE-BY | PRE-SCALER COUNT | DIVIDE-BY-7 COUNT | DETECTION |
|---|---|---|---|---|
| 1 | 2 | 01 | 000 | |
| 2 | 2 | 10 | 000 | <*** |
| 3 | 2 | 01 | 001 | |
| 4 | 2 | 10 | 001 | |
| 5 | 2 | 01 | 010 | |
| 6 | 2 | 10 | 010 | <*** |
| 7 | 2 | 01 | 011 | |
| 8 | 2 | 10 | 011 | |
| 9 | 2 | 01 | 100 | |
| 10 | 2 | 10 | 100 | <*** |
| 11 | 2 | 01 | 101 | |
| 12 | 2 | 10 | 101 | |
| 13 | 3 | 01 | 110 | |
| 14 | 3 | 10 | 110 | <*** |
| 15 | 3 | 00 | 110 | |

Note in Table 3 the detected state is always a state in which the slower divide-by-7 ripple counter has had a full clock cycle to stabilize before the fast prescaler reaches the detected state.

As can be seen in FIGS. 2 and 3, the occurrence of states 2, 6, 10 and 14 produced by the two-stage counter 11 are detected by 2,6 detector 12 and 10,14 detector 13. The output of the 2,6 detector 12 is node A, the input to flip-flop FF1. The signal labeled A in FIG. 3 is the signal seen at node A in FIG. 2. The output of the 10,14 detector 13 is the signal on node B, the input to flip-flop FF3 and labeled B in FIG. 3. The pulses on A are delayed one clock period by flip-flop FF1 and another half period by flip-flop FF2, to become the signal C shown in FIG. 3. The pulses on B are delayed one clock period by FF3 to become the signal labeled D. The C and D signals are ORed and inverted by NOR gate 17 to produce signal E in FIG. 3. Flip-flop FF4 toggles in response to signal E to produce the divide-by-7.5 output shown at the bottom of FIG. 3. Note that the divide-by-7.5 output indeed has a period that is 7.5 cycles of the input VCO clock signal at the top of FIG. 3, e.g. from the middle of state 4 to the beginning of state 12.

Because both edges of the reference clock signal are used in generating the divided-by-7.5 output clock signal for the NTSC D2 standard, a small amount of F/2 phase modulation can arise in the output clock if the reference clock is not perfectly symmetrical. It is therefore desirable to produce a reference clock that has as much symmetry as possible, and balanced circuitry is employed to achieve this result. To the extent that the symmetry is imperfect, some phase modulation is present in the output. The upper bound on this phase modulation is 180/7.5 or 24 degrees, but in practice it will be very much less.

The divide-by-7.5 output signal is one input to multiplexer 21. Another input to multiplexer 21 is the divide-by-3 output of the prescaler portion of the two-stage counter 11. The prescaler also produces a divide-by-2 output. The divide-by-2 and divide-by-3 outputs of the prescaler portion of the two-stage counter 11 are each applied to one of the divide-by-2 circuits 15 and 14. The outputs of these divide-by-2 circuits 15 and 14 are divide-by-4 and divide-by-6 outputs, respectively, and these are also applied to the inputs of the multiplexer 21.

Factor select signals select the appropriate multiplexer 21 input as the multiplexer output. The factor select signals are also applied to the two-stage counter 11 to set it up for the desired mode of operation, divide-by-2. divide-by-3 or divide-by-7.5.

While the divide-by-3, 4, 6 or 7.5 circuitry 18 is shown in FIG. 2 as having four divide-by-2 circuits, i.e., the prescaler portion of the two-stage counter 11, divide-by-2 circuits 14 and 15, and FF4, with additional multiplexing two of these could be eliminated to produce an additional power consumption reduction.

Figure 4:
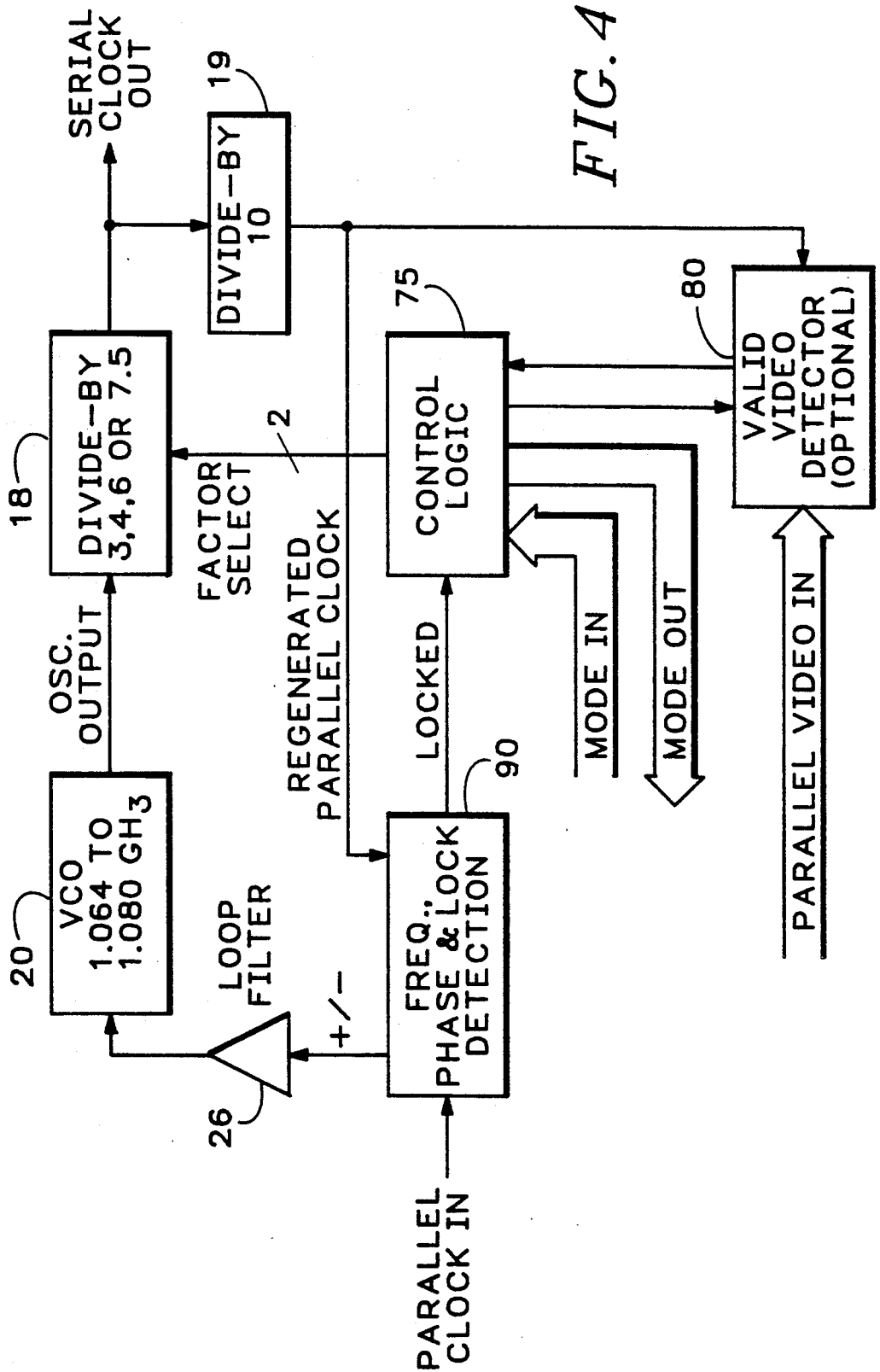
FIG. 4 is a block diagram of a circuit suitable for implementing the automatic video format identification aspect of the present invention in the context of a serializer.
Figure 5:
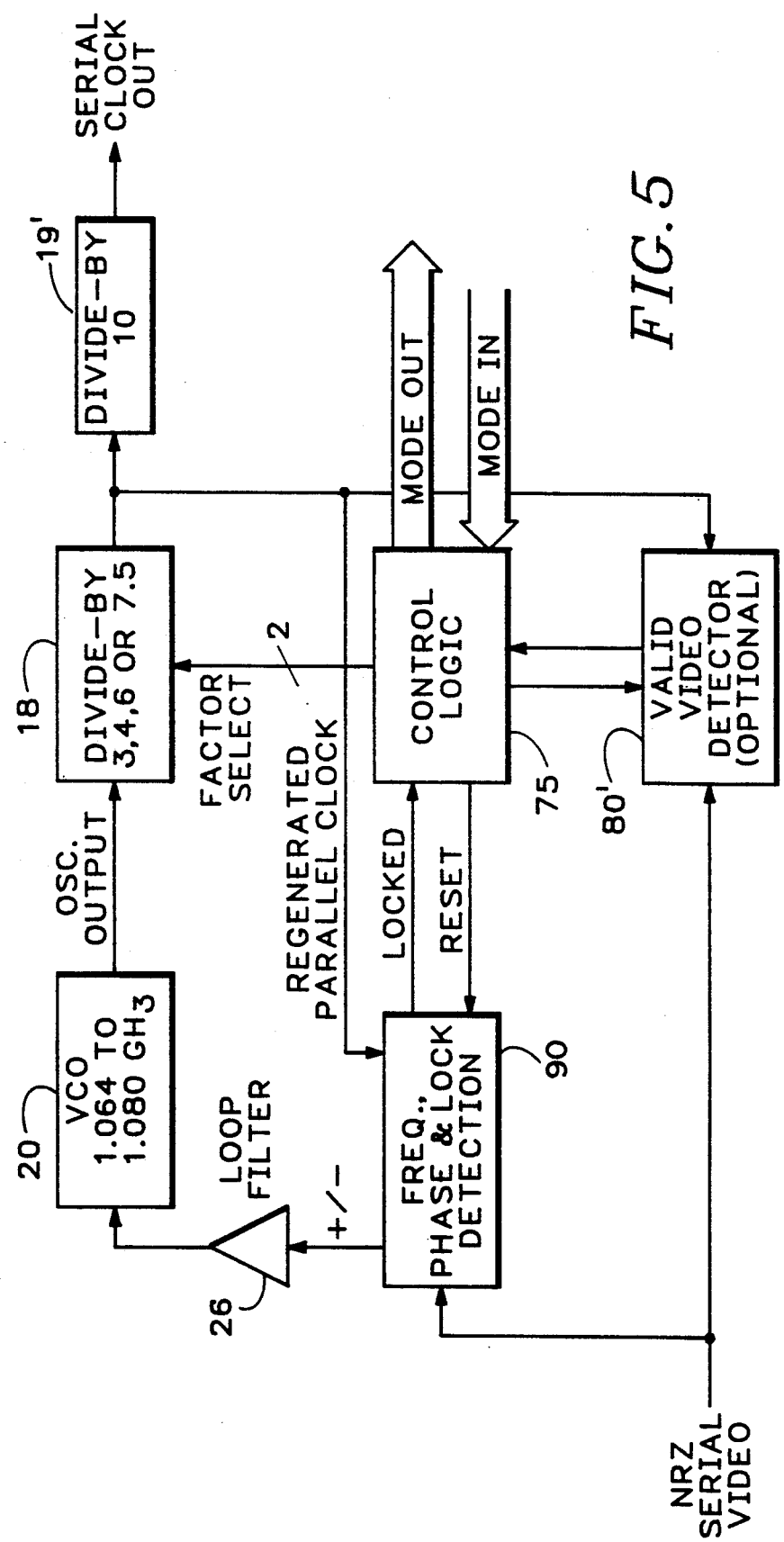
FIG. 5 is a block diagram of a circuit suitable for implementing the automatic video format identification aspect of the present invention in the context of a deserializer.

Referring now to FIGS. 4 and 5, the present invention may be used in a phase lock loop that is part of a video serializer or a deserializer. A video serializer converts video information from parallel to serial, and a video deserializer converts video information from serial to parallel. Typically, the parallel information in each of these formats is 10 bits wide. FIG. 4 shows a suitable serializer implementation according to one aspect of the present invention, while FIG. 5 shows a suitable deserializer implementation.

In FIG. 4, a parallel clock input is applied to a frequency, phase and lock detector 90 that is part of a phase lock loop. The frequency, phase and lock detector 90, which is shown in greater detail in FIG. 6, includes a phase detector 10, a frequency detector 50, and a lock detector 30. The frequency, phase and lock detector 90 has up (+) and down (−) outputs which are inputs to a loop filter 26. The loop filter 26 produces a control voltage for the VCO 20. The loop filter 26, which is suitably a charge pump, receives the "up" and "down" pulses from the frequency, phase and lock detector 90 and integrates their difference into an analog VCO control signal with only low frequency components.

The oscillator output is divided by 3, 4, 6 or 7.5 by the divide-by circuitry 18 according to the state of the factor selection signals from control logic 75. If the loop is properly locked, the output of the divide-by circuit 18 is the desired serial clock. The output of the divide-by circuit 18 is further divided by 10 in the divide-by-10 circuit 19 to produce a regenerated parallel clock signal. The regenerated parallel clock signal is compared with the input parallel clock signal by frequency, phase and lock detector 90. As noted above, the +/− outputs of the frequency, phase and lock detector 90 go to the loop filter 26 to control the VCO output frequency. The frequency, phase and lock detector 90 also produces a "lock" output which is monitored by the control logic 75, so that the control logic 75 is informed when lock has been achieved and when it is lost.

The control logic 75 receives three bits of "mode in" information and produces three bits of "mode out" information. Another bit of each could be added and reserved for future video standards or used for test purposes. The significance of the status of the three bits used is described in Table 4 and the text that follows.

TABLE 4

| MODE-IN MODE-OUT CODES | | | |
|---|---|---|---|
| Mode In | | Mode Out | |
| 000 | Chip Reset | 000 | PLL Unlocked |
| 001 | NTSC D2 | 001 | NTSC D2 Acquired |
| 010 | NTSC D2 w/TRS | 010 | PAL D2 Acquired |
| 011 | PAL D2 | 011 | D1 Acquired |
| 100 | PAL D2 w/TRS | 100 | 360 Megabit Acquired |
| 101 | D1 | 101 | Reserved |
| 110 | 360 Megabit | 110 | Reserved |
| 111 | Automatic | 111 | Invalid Video |

The "mode in" codes direct the control logic 75 to set the divide-by circuitry 18 to the divide-by constants associated with NTSC D2, PAL D2, D1 or 360 Megabit, or whether it should engage in its own routine for determining the mode. i.e., "Automatic" mode. The NTSC D2 w/TRS and PAL D2 w/TRS modes are used instead of the NTSC D2 and PAL D2 modes when timing reference signals are to be included (using circuitry not shown, but also under the control of the control logic 75). "Chip Reset", as the name implies, puts everything into a known state.

The "mode out" codes are used by the control logic 75 to inform other circuitry about the status of the circuitry under its control. "PLL Unlocked" indicates that the phase lock loop is not locked, either due to an improper data rate or no input at all. "PLL Unlocked" is reported while the input mode is "Automatic" and the control logic is still hunting for the right frequency, and while it has been directed to a particular frequency by the "mode in" signal and it cannot lock on because the parallel clock is at a different frequency.

If the phase lock loop is locked on, but the (optional) valid video detector 80 has not found valid video, "Invalid Video" is reported on the "mode out" lines. When a valid video signal is detected, the corresponding NTSC D2, PAL D2, D1 or 360 Megabit "Acquired" code is reported. The valid video detector 80, if used at all, can be made to have varying levels of complexity. Sufficient theory to construct one with an appropriate level of complexity can be found in *Digital Transmission Systems* by David R. Smith, published by Van Nostrand Reinhold Company, 1985, hereby incorporated by reference. This textbook contains an explanation of the prior art on digital framing and acquisition in the presence of signal impairments.

In the Automatic mode the control logic 75 directs the divide-by 3, 4, 6 or 7.5 circuitry 18 to divide by 7.5, the number associated with the NTSC D2 format. The modes are tried in the order of their frequency, from lowest to highest, to avoid locking on to harmonics. If the input mode is not one of the "w/TRS" modes, the control logic produces the appropriate "Acquired" mode out signal. If one of the "w/TRS" modes has been selected, the control logic 75 directs the valid video detector 80 to look for valid TRS signals within the current standard. If a valid TRS signal is detected, the control logic 75 generates the appropriate "Acquired" mode out signal to indicate that a lock has been acquired in that format.

The control logic 75 gives the phase lock loop time for the lock detector 30 in the frequency, phase and lock detector 90 about 60 microseconds, or the time for one line of video, to indicate that a lock has been detected. If no phase lock indication occurs that time, the control logic 75 directs the divide-by circuitry 18 to divide by the number associated with the format having the next higher frequency. The control logic 75 also resets the frequency, phase and lock detector 90, and then waits for another line interval to see if the lock detector 30 will indicate a lock at the new frequency. If a lock is detected and the "mode in" is one of the "w/TRS" modes, the valid video detector 80 is given several line intervals to detect the timing reference signal.

If the desired mode is not acquired at the current frequency, the control logic 75 continues with this cycling through the possibilities looking for a successful acquisition until one is found. In some applications, the clock generation circuitry may be put in the automatic mode before any video is actually applied to its input. Valid video detector 80 is required when the clock generation circuitry is used this way, since locking on a harmonic of an incorrect frequency is more likely when it is not known where in the sequence of video standards the circuitry will be when the incoming video first appears.

Referring now to FIG. 5, the deserializing implementation is very similar to the serializing one, except the divide-by-10 circuit 19' output is now used as a parallel clock output, while the output of the divide-by 3, 4, 6 or 7.5 circuit 18 is applied to the frequency, phase and lock detector 90. It should be noted that the phase modulation of the divide-by-7.5 clock output described above does not appear in the parallel clock output of divide-by-10 circuit 19', because the divide-by-10 operation in series with the divide-by-7.5 operation is effectively a divide-by-75 operation and the parallel clock output always changes state on the same edge of the VCO clock.

Another difference between the serializing implementation and the deserializing one is that the (optional) valid video detector 80' is now examining a serial, rather than parallel, video input signal.

Note in FIGS. 4 and 5 that the "mode in" and "mode out" signals are shown as coming and going from the same direction as the parallel is coming or going. Because these circuits are usually used to convert between external serial and internal parallel data for a piece of video equipment, the external environment is assumed to be in the direction where the data environment is serial, and the instrument controller or other mode determining circuitry is assumed to be in the direction of the circuitry that operates on parallel data.

Figure 6:
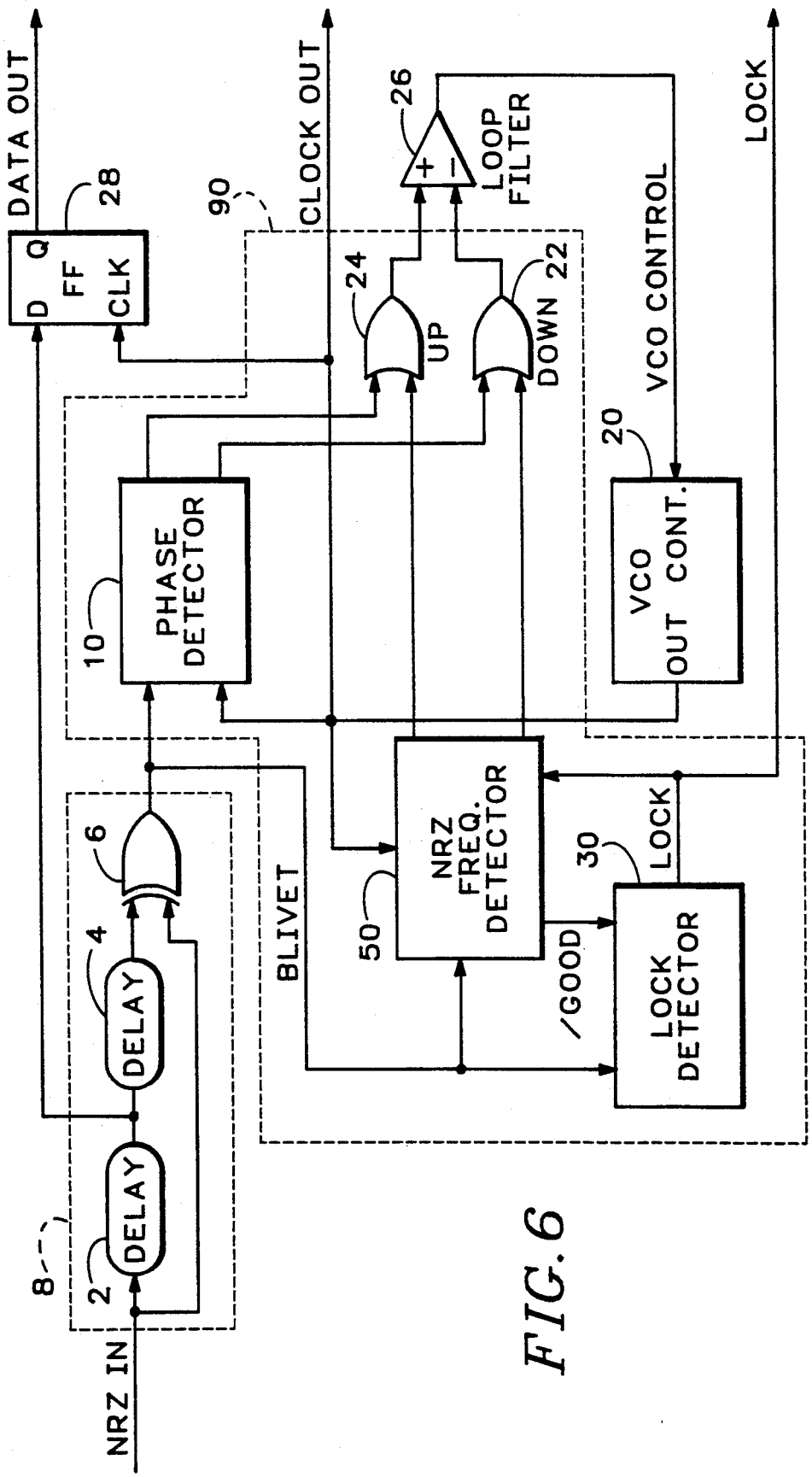
FIG. 6 is a block diagram of an NRZ clock and data recovery system including a phase detector, a frequency detector and a lock detector arrangement suitable for implementing the present invention.

Referring now to FIG. 6, the frequency, phase and lock detector 90 utilized in the present invention was implemented in a complete system for NRZ clock and data recovery that includes all of the circuitry shown in FIG. 6. This NRZ clock and data recovery system is the subject matter of co-pending patent application Ser. No. 07/665,861 filed on Mar. 7, 1991 by the same inventor, hereby incorporated by reference.

In the system shown in FIG. 6, the blivet signal is supplied to the phase detector 10, NRZ frequency detector 50 and the lock detector 30. The NRZ frequency detector 50 also receives the clock output of the VCO 20 and a "lock" signal from the lock detector 30. Both the phase detector 10 and the NRZ frequency detector 50 produce "up" and "down" signals to steer the VCO 20 via the loop filter 26. These "up" and "down" signals are combined with the "up" and "down" signals from the phase detector 10 by up OR gate 24 and down OR gate 22. The NRZ frequency detector 50 also produces/good (not-good) signals that inform the lock detector 30 when the present blivet is going to cause an "up" or "down" signal.

Figure 7:
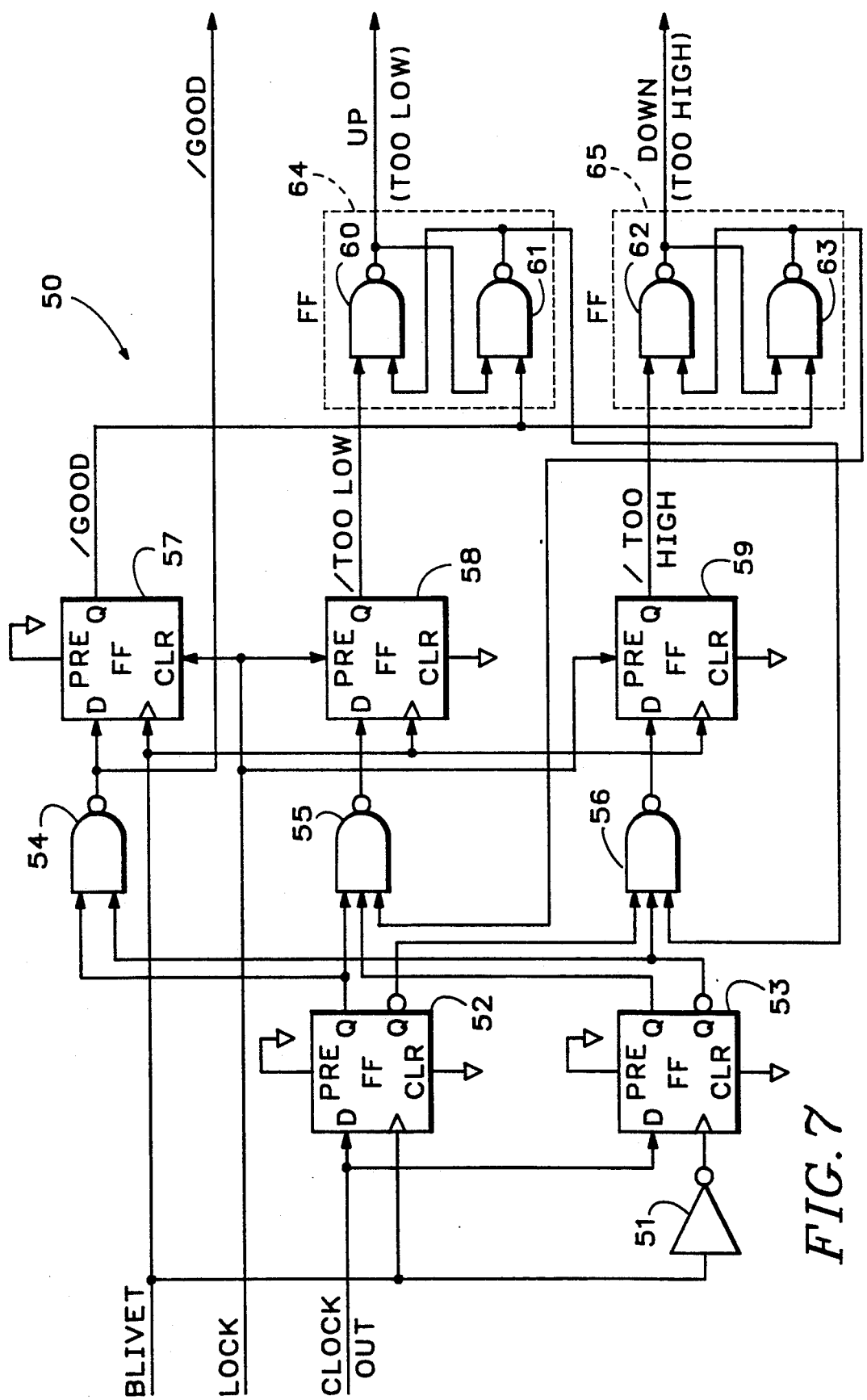
FIG. 7 is schematic diagram of the frequency detector used in the NRZ clock and data recovery system.

Referring now to FIG. 7, the NRZ frequency detector 50 contains four flip-flops 52, 57, 58 and 59 that are clocked by the rising edge of the blivet signal and one flip-flop 53 that is clocked by the falling edge of the blivet signal, due to the operation of inverter 51. Flip-flops 52 and 53 monitor the clock output of the VCO 20 on opposite edges of the blivet signal. A "good" blivet is a blivet whose rising edge occurs while the VCO 20 clock out is high and whose falling edge occurs while it is low. A good blivet therefore sets flip-flop 52 and resets flip-flop 53. NAND gate 54 monitors the Q output of flip-flop 52 and the /Q output of flip-flop 53, and produces a low output whenever a good blivet has been detected by these two flip-flops.

Table 5 summarizes the information inferred by the NRZ frequency detector 50 circuitry from the relationship between the clock output level and the blivet edges:

TABLE 5

| CLOCK/BLIVET INFERENCES | | |
|---|---|---|
| High-going Edge (FF52) | Low-going Edge (FF53) | Frequency Inference |
| 1 | 0 | Good |
| 1 | 1 | Too Low |
| 0 | 0 | Too High |
| 0 | 1 | Unclear (?) |

NAND gate 55 monitors the states of flip-flops 52 and 53 for the "too-low" condition, i.e., both flip-flops having a high output. The third input to this NAND gate 55 is from the D-C flip-flop created by NAND gates 62 and 63, which produce a high output from NAND gate 62 and a low output from NAND gate 63 when the frequency is too high. The reason for this third input to NAND gate 55 is to prevent going directly from a "too-high" condition to a "too-low" condition without going through a good state in-between. Thus, when the last state out of the NRZ frequency detector was "Down (too-high)", NAND gate 55 is prevented from producing an active-low output indicating that the next state should be "Up (too-low)" by the low output of NAND gate 63.

Similarly, NAND gate 56 monitors the states of flip-flops 52 and 53 for the "too-high" condition, i.e., both flip-flops having a low output. And, in the same way as before, a high output of NAND gate 61 in the other D-C flip-flop, indicating that the last state was not "too-low", is required before an active "too-high" signal can be produced.

The D-C flip-flops 64 and 65, comprising NAND gates 60,61 and 62,63, hold the last known frequency direction, too-low, too-high or neither, until a /good blivet occurs. An active low /good signal attempts to clear both of the D-C flip-flops, and will do so in the absence of an active low /too-low or /too-high signal.

The state of the NAND gates 54, 55 and 56 is clocked into flip-flops 57, 58 and 59, respectively, by the rising edge of the next blivet, if the signal Lock is inactive low, indicating that the phase lock loop is not locked. If the signal Lock is active high, indicating that a phase lock loop lock has been detected, the signal Lock forces the /good flip-flop 57 to its cleared state, producing an inactive high output from that flip-flop, which indicates that the state is "good". The active high Lock signal also forces the "too-low" and "too-high" flip-flops to ignore their inputs from NAND gates 55 and 56, respectively, and produce inactive high outputs. Thus, while the loop is locked, the NRZ frequency detector cannot produce any output to disrupt that lock, leaving control entirely up to the phase detector 10.

Note, however, that even while the loop is locked and the up and down outputs of the NRZ frequency detector 50 are disabled, it can still produce /good (blivet) signal outputs from NAND gate 54. Thus, as will be further explained below, if enough /good blivets are detected, the lock detector 30 can respond by going to an unlocked condition.

Figure 8:
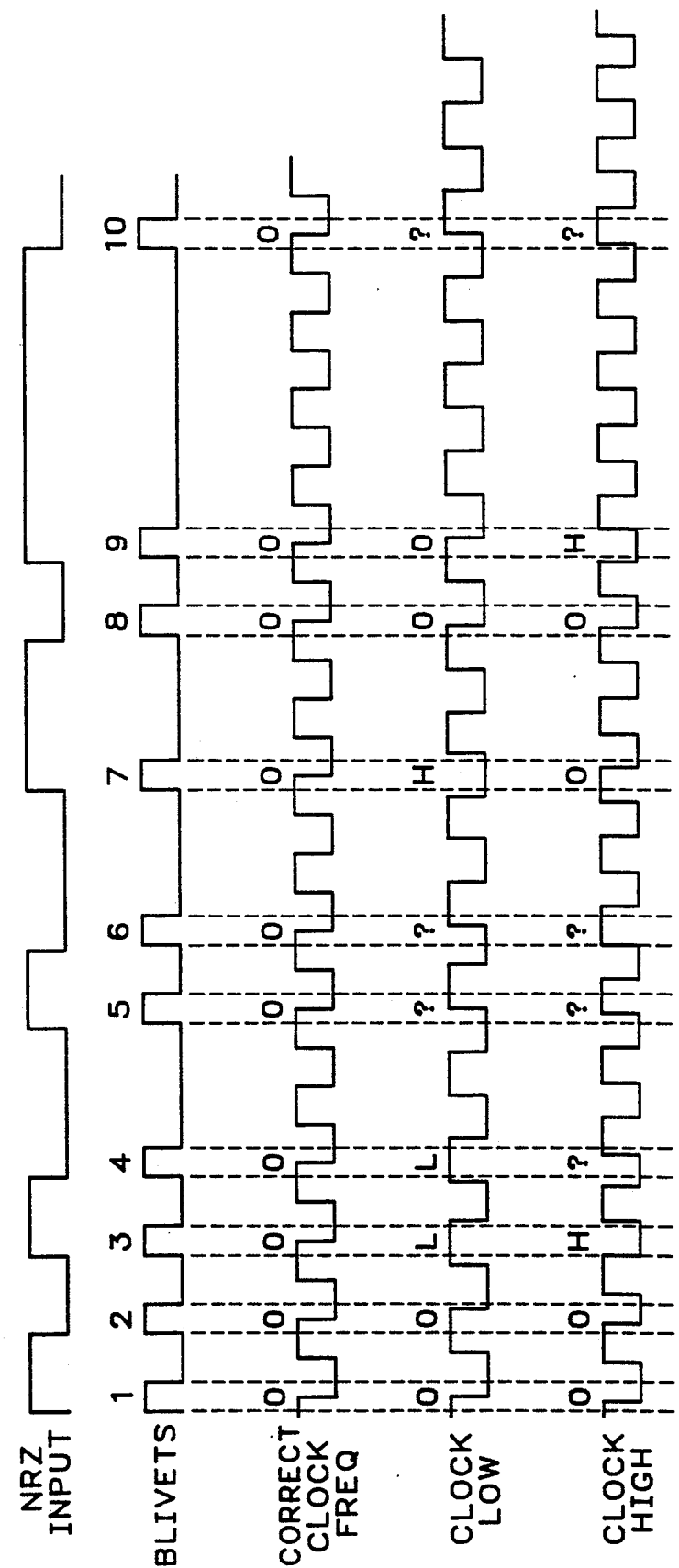
FIG. 8 is a timing diagram of the operation of the frequency detector shown in FIG. 7.

Referring now to FIG. 8, a series of blivets produces appropriate results in the presence of three different clock frequencies, one correct, one too-high and one too-low. In FIG. 8, good relationships between blivets and clock levels are indicated by "O"s above clock signal, while too-low relationships are indicated with an "L" and too-highs with an "H". Unclear results, where the clock is low for the rising blivet edge and high for falling blivet edge, are indicated with a "?".

Everything is simple for the "Correct Clock Freq" line, with each blivet producing a "O". The "Clock Low" line is much more interesting, producing the sequence of relationships: "OOLL??HOO?". The unclear, ?, indications are totally unrecognized by the circuitry shown in FIG. 7, so the "H" at blivet 7 is ignored because the last indication was a "L" and so the output of NAND gate 61 is low disabling NAND gate 56 which would otherwise detect this "H". Even though the "H" is not detected, the failure to satisfy NAND gate 54 because the Q output of flip-flop 52 is low causes the output of NAND gate 54 to go high, and this high is clocked into flip-flop 57 by the next blivet (blivet 8). The continuing high output of flip-flop 57 has no effect on the D-C flip-flops comprising NAND gates 60,61 and 62,63.

The good blivet at blivet 8 is detected by NAND gate 54, whose output goes low in response. The good state of flip-flops 52 and 53 also means that neither of the other NAND gates 55 or 56 are satisfied. The low output of NAND gate 54 is clocked into flip-flop 57 on the rising edge of blivet 9. The same rising clock edge of blivet 9 also clocks the high levels that are present on the outputs of NAND gates 55 and 56 into flip-flops 58 and 59, respectively. The low output of flip-flop 57 immediately clears the two D-C flip-flops 60,61 and 62,63, so that their outputs on NAND gates 60 and 62 become low, since both of their inputs are now high. The cleared states of the D-C flip-flops 60,61 and 62,63 enable the third inputs to NAND gates 55 and 56, allowing them to detect the next high or low state. If the frequency were now correct, mostly good blivets would be detected from now on and the NRZ frequency detector would behave as it does on the line labeled "Correct Clock Freq".

In the absence of jitter, an incorrect frequency will produce indications like those shown in FIG. 8, in which the desired indication always follows a good blivet, and any erroneous indications always follow a desired indication and are locked out by it. In the presence of jitter, however, erroneous indications sometimes follow a good blivet and reach the output. Even in the presence of heavy jitter, though, the desired indications always heavily out-weigh the erroneous ones and the system successfully locks onto the correct frequency.

Referring now to FIG. 9, the lock detector 30 is implemented completely in digital form and therefore does not require an analog integration capacitor and associated IC pin. This is a significant benefit, since a shortage of IC pins is an important design constraint in the environment where this invention is used. The all digital design is accomplished by using a saturating up/down counter that increments by one on each successful good blivet, but decrements by a value greater than one upon the occurrence of each/good blivet. When the count in the counter is above some threshold, for example more than half full, a "lock" signal is generated.

The saturating up/down counter 42 is a counter that does not wrap around, i.e., when it reaches a full count, it maintains it as additional increment signals are received. The saturating up/down counter 42 is incremented by incrementing means 38 whenever a "good" blivet is detected by AND gate 32, and decremented by decrementing means 40 whenever a "bad" blivet is detected by AND gate 36. Inverter 34 changes the /good signal into a good signal for AND gate 32.

The ratio of the increment step size (typically one) to the decrement step size (typically some multiple of increment size) determines the tolerance of the lock detector 30 to jitter. A 1:4 ratio has been found to provide a suitable jitter tolerance. The size of the saturating up/down counter 42 (in bits) determines the integration time of the lock detector 30, and hence its response time to a locked or unlocked condition. There is a trade-off between the speed with which a lock is identified and the certainty of that identification. In the present application, 12 bits of binary, for a total count of 4096, has been found to be a suitable length for this counter, so that a Lock indication appears after a count of 2048. If jitter is minimal, a Lock indication is achieved in about 15 microseconds at 270 Megabits per second.

Thus far the technique of this invention has only been described in terms of the common harmonics in the vicinity of 2144 MHz and half of that frequency. However, as is shown in Tables 6 and 7, there are other possibilities for similar "harmonic convergence". The one described in Table 2 was chosen as requiring the smallest VCO tuning, but, by using an external varactor, a somewhat larger range of VCO tuning expands the possibilities.

TABLE 6

| STANDARD | FREQUENCY (MHz) | FACTOR | HARMONIC (MHz) |
|---|---|---|---|
| NTSC D2 | 143.182 | 4 | 572.727 |
| PAL D2 | 177.345 | 3 | 532.034 |
| D1 | 270.000 | 2 | 540.000 |
| Proposed | 360.000 | 1.5 | 540.000 |
| | | MID FREQ.: | 552.381 |
| | | Maximum required tuning: | 3.7% |

TABLE 7

| STANDARD | FREQUENCY (MHz) | FACTOR | HARMONIC (MHz) |
|---|---|---|---|
| NTSC D2 | 143.182 | 11 | 1575.002 |
| PAL D2 | 177.345 | 9 | 1596.103 |
| D1 | 270.000 | 6 | 1620.000 |
| Proposed | 360.000 | 4.5 | 1620.000 |
| | | MID FREQ.: | 1597.501 |
| | | Maximum required tuning: | 1.4% |

While a preferred embodiment of the present invention has been shown and described, it will be apparent to those skilled in the art that many changes and modifications may be made without departing from the invention in its broader aspects. For example, in some of the contexts discussed above, some other type of frequency source might be usefully substituted for the voltage controlled oscillator described. The claims that follow are therefore intended to cover all such changes and modifications as fall within the true spirit and scope of the invention.

I claim:

1. A multiple standard video frequency clock source for generating clock signals at a first frequency and a second frequency, where the first frequency corresponds to the digital data rate of a first video standard and the second frequency corresponds to the digital data rate of a second video standard, the clock source comprising:
- a frequency source whose output is a first frequency source output frequency or a second frequency source output frequency depending on the status of a frequency source output frequency control signal;
- frequency dividing means for dividing the frequency source output frequency by a first constant in response to a first control signal to produce a first frequency and by a second constant in response to a second control signal to produce a second frequency; and
- controlling means for producing the frequency source output frequency control signal, the first control signal and the second control signal according to which video standard is being used.

2. A multiple standard video frequency clock source according to claim 1 wherein the frequency source is an LC type voltage controlled oscillator.

3. A multiple standard video frequency clock source according to claim 1 wherein the first and second frequency source output frequencies are between 1.064 GHz and 1.080 GHz and the associated constants are chosen from the following set of standard frequencies and associated constants:
- 143.182 MHz clock and 7.5 constant;
- 177.345 MHz clock and 6 constant;
- 270.000 MHz clock and 4 constant; and
- 360.000 MHz clock and 3 constant.

4. A multiple standard video frequency clock source according to claim 1 wherein the first and second frequency source output frequencies are between 2.128 GHz and 2.160 GHz and the associated constants are chosen from the following set of standard frequencies and associated constants:
- 143.182 MHz clock and 15 constant;
- 177.345 MHz clock and 12 constant;
- 270.000 MHz clock and 8 constant; and
- 360.000 MHz clock and 6 constant.

5. A multiple standard video frequency clock source according to claim 1 wherein the first and second frequency source output frequencies are between 532 MHz and 573 MHz and the associated constants are chosen from the following set of standard frequencies and associated constants:
- 143.182 MHz clock and 4 constant;
- 177.345 MHz clock and 3 constant;
- 270.000 MHz clock and 2 constant; and
- 360.000 MHz clock and 1.5 constant.

6. A multiple standard video frequency clock source according to claim 1 wherein the first and second frequency source output frequencies are between 1.575 GHz and 1.620 GHz and the associated constants are chosen from the following set of standard frequencies and associated constants:
- 143.182 MHz clock and 11 constant;
- 177 345 MHz clock and 9 constant;
- 270.000 MHz clock and 6 constant; and
- 360.000 MHz clock and 4.5 constant.

7. A method for generating multiple standard video frequency clock signals at a first frequency and a second frequency, where the first frequency corresponds to the serial digital data rate of a first video standard and the second frequency corresponds to the serial digital data rate of a second video standard, the method comprising the steps of:
- adjusting a frequency source to a first frequency source output frequency or a second frequency source output frequency depending on the status of a frequency source output frequency control signal;
- dividing the frequency source output frequency by a first constant in response to a first control signal to produce the first frequency;
- dividing the frequency source output frequency by a second constant in response to a second control signal to produce the second frequency; and
- controlling the frequency source output frequency control signal, the first control signal and the second control signal according to which video standard is being used.

8. A method according to claim 7 wherein the first and second frequency source output frequencies are between 1.064 GHz and 1.080 GHz and the associated constants are chosen from the following set of standard frequencies and associated constants:
- 143.182 MHz clock and 7.5 constant;
- 177.345 MHz clock and 6 constant;
- 270.000 MHz clock and 4 constant; and
- 360.000 MHz clock and 3 constant.

9. A method according to claim 7 wherein the first and second frequency source output frequencies are between 2.128 GHz and 2.160 GHz and the associated constants are chosen from the following set of standard frequencies and associated constants:
- 143.182 MHz clock and 15 constant;
- 177.345 MHz clock and 12 constant;
- 270.000 MHz clock and 8 constant; and
- 360.000 MHz clock and 6 constant.

10. A method according to claim 7 wherein the first and second frequency source output frequencies are between 532 MHz and 573 MHz and the associated constants are chosen from the following set of standard frequencies and associated constants:
- 143.182 MHz clock and 4 constant;
- 177.345 MHz clock and 3 constant;
- 270.000 MHz clock and 2 constant; and
- 360.000 MHz clock and 1.5 constant.

11. A method according to claim 7 wherein the first and second frequency source output frequencies are between 1.575 GHz and 1.620 GHz and the associated constants are chosen from the following set of standard frequencies and associated constants:
- 143.182 MHz clock and 11 constant;
- 177.345 MHz clock and 9 constant;
- 270.000 MHz clock and 6 constant; and
- 360.000 MHz clock and 4.5 constant.

12. A method according to claim 7 further comprising the step of determining from among a set of video standards for which appropriate clock signals can be produced which video standard is being used as an unknown video standard input.

13. A method according to claim 12 wherein the determining step comprises the steps of:
- (a) receiving an input clock signal from the unknown video standard as an external input to a phase lock loop;
- (b) controlling the phase lock loop to produce a clock signal appropriate to a first member of the set of video standards;
- (c) monitoring the phase lock loop with a lock detector for a predetermined time;

(d) generating a locked indication and continuing to produce the clock signal if the lock detector detects a lock within the predetermined time; and (e) repeating steps (b) through (d) substituting a second member of the set of video standards for the first member if the locked indication is not detected within the predetermined time.

14. A method according to claim 13 wherein the first member of the set of video standards is the member that requires the lowest clock frequency.

15. A method according to claim 14 wherein the second member of the set of video standards is the member that requires the next lowest clock frequency.

16. A method according to claim 13 wherein the second member of the set of video standards is the member that requires the next higher clock frequency than the first member.

17. A method for automatically producing a clock signal appropriate to an unknown video standard that is one of a set of video standards for which appropriate clock signals can be produced, the method comprising the steps of:

(a) receiving an input clock signal from the unknown video standard as an external input to a phase lock loop;

(b) controlling the phase lock loop to produce a clock signal appropriate to a first member of the set of video standards;

(c) monitoring the phase lock loop with a lock detector for a predetermined time;

(d) generating a locked indication and continuing to produce the clock signal if the lock detector detects a lock within the predetermined time; and (e) repeating steps (b) through (d) substituting a second member of the set of video standards for the first member if the locked indication is not detected within the predetermined time.

18. A method according to claim 17 wherein the first member of the set of video standards is the member that requires the lowest clock frequency.

19. A method according to claim 18 wherein the second member of the set of video standards is the member that requires the next lowest clock frequency.

20. A method according to claim 17 wherein the second member of the set of video standards is the member that requires the next higher clock frequency than the first member.

* * * * *